(12) United States Patent
Embleton et al.

(10) Patent No.: US 11,409,474 B2
(45) Date of Patent: Aug. 9, 2022

(54) SYSTEMS AND METHODS FOR COMMUNICATING EXTERNALLY FROM A SEALED VOLUME

(71) Applicant: Dell Products L.P., Round Rock, TX (US)

(72) Inventors: Steve Embleton, Austin, TX (US); Ben J. Sy, Austin, TX (US); Eric M. Tunks, Austin, TX (US); Travis C. West-Edwards, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 101 days.

(21) Appl. No.: 16/853,177

(22) Filed: Apr. 20, 2020

(65) Prior Publication Data
US 2021/0326077 A1    Oct. 21, 2021

(51) Int. Cl.
*G06F 3/06* (2006.01)

(52) U.S. Cl.
CPC .......... *G06F 3/0677* (2013.01); *G06F 3/0607* (2013.01); *G06F 3/0635* (2013.01); *G06F 3/0653* (2013.01)

(58) Field of Classification Search
CPC . H04B 10/0779; H04B 10/40; H04J 14/0227; H04J 14/0238; H04J 14/0241; H04J 14/0283; H04J 14/0284; H04J 14/0286; H04J 14/0291; H04J 14/0294; H04J 14/0295; H04J 14/0297; H04Q 11/0066; H04Q 11/0071; H04Q 2011/0016; H04Q 2011/0024; H04Q 2011/0033; H04Q 2011/0064; H04Q 2011/0073; H04Q 2011/0075; H04Q 2011/0081; H04Q 2011/0083; H04Q 2011/0086; H04Q 2011/0088
See application file for complete search history.

(56) References Cited

U.S. PATENT DOCUMENTS

2017/0026124 A1* 1/2017 Masini ............... H04B 10/0779
2018/0348831 A1* 12/2018 de Bock ................ H05K 7/209
2021/0018546 A1* 1/2021 Embleton ............... G06F 1/182

* cited by examiner

*Primary Examiner* — Yong J Choe
(74) *Attorney, Agent, or Firm* — Jackson Walker L.L.P.

(57) ABSTRACT

A data processing device may include an internal volume that is sealed from space outside the internal volume and an optical system. The optical system may include a first portion, disposed in the internal volume, adapted to receive network data units from devices disposed in the internal volume and a second portion of the optical system. The optical system may also include the second portion, disposed outside of the internal volume, adapted to obtain the network data units from the first portion via an optical connection using transmission at optical frequencies.

22 Claims, 8 Drawing Sheets

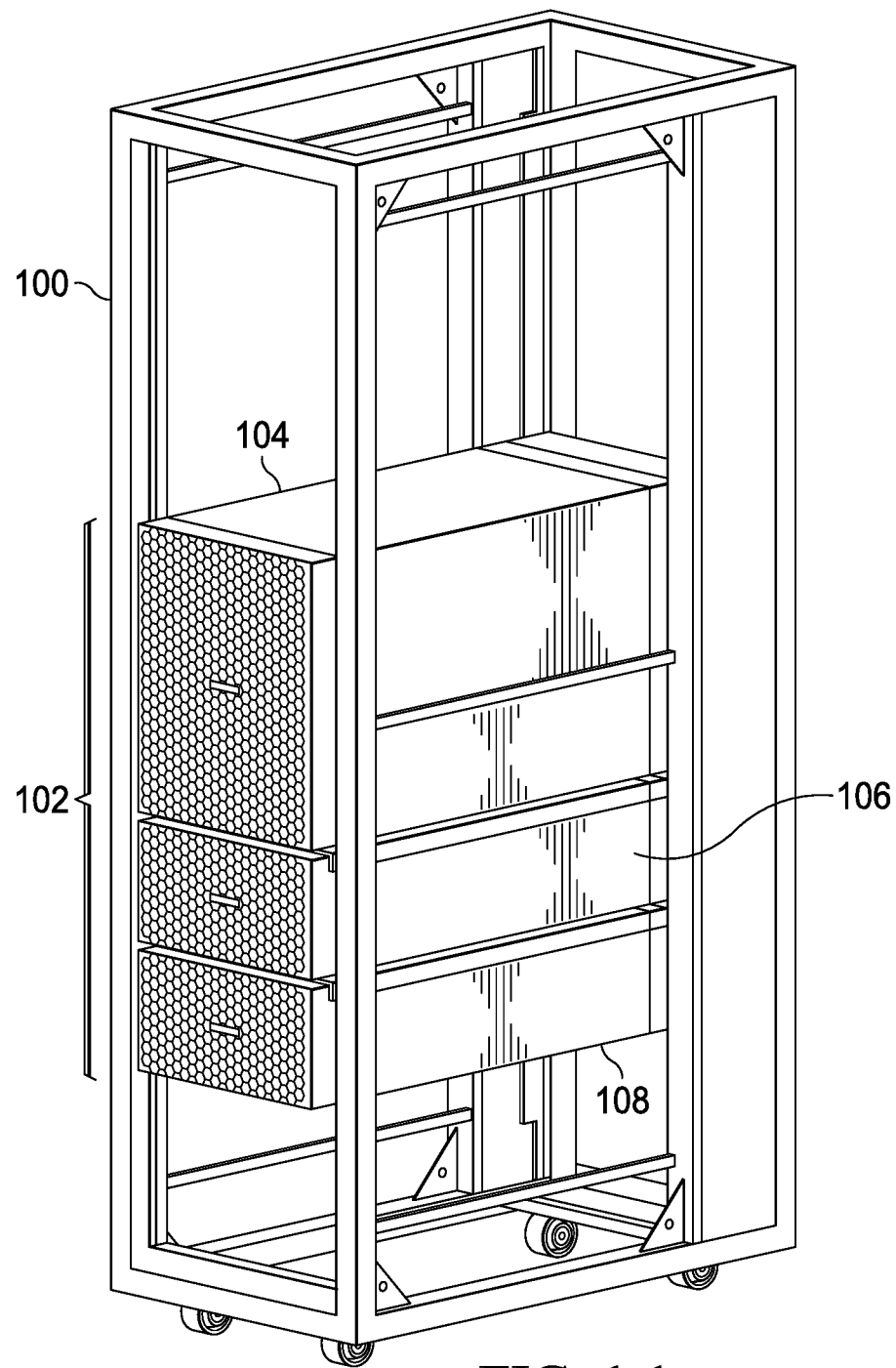
FIG. 1.1

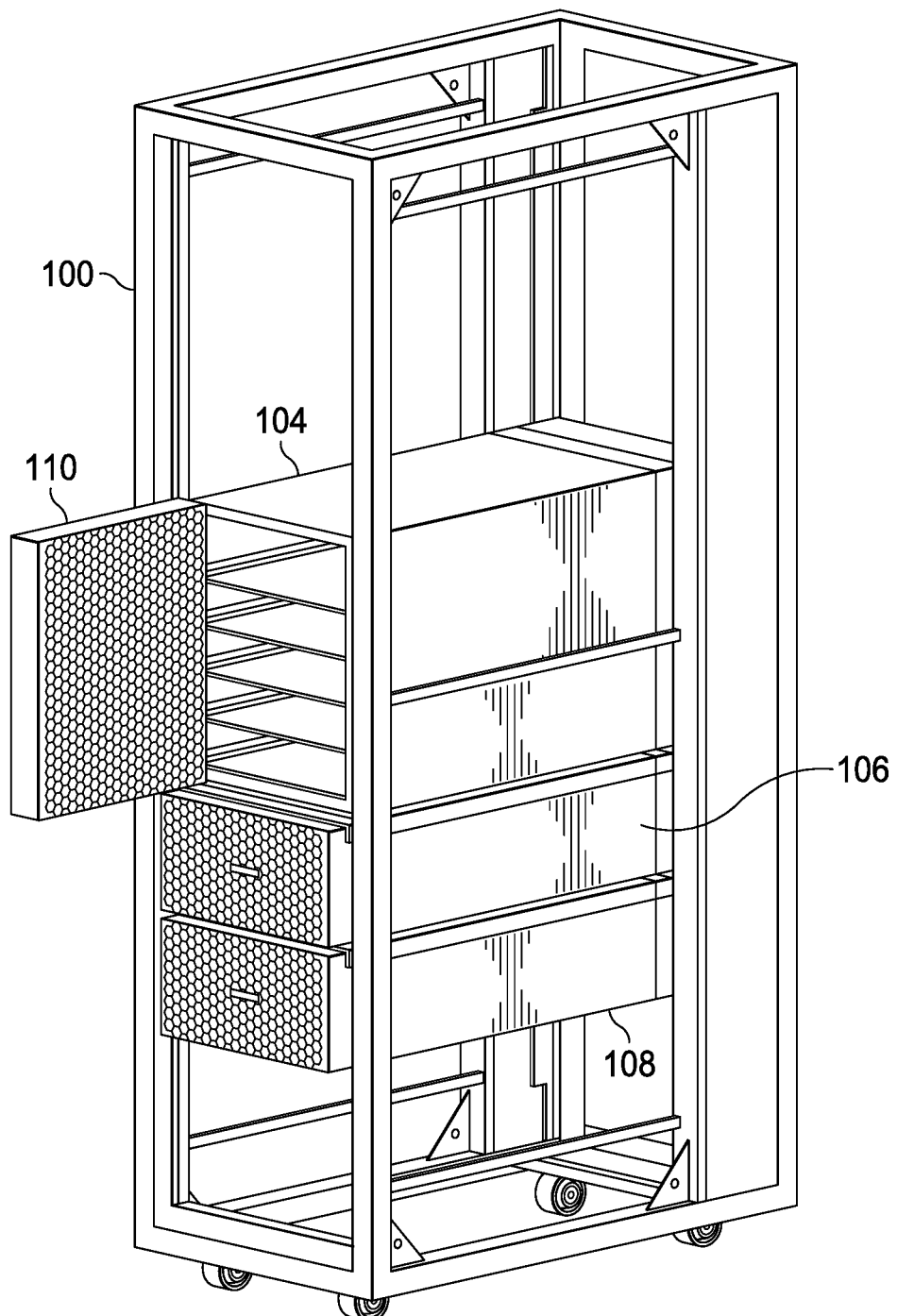
FIG. 1.2

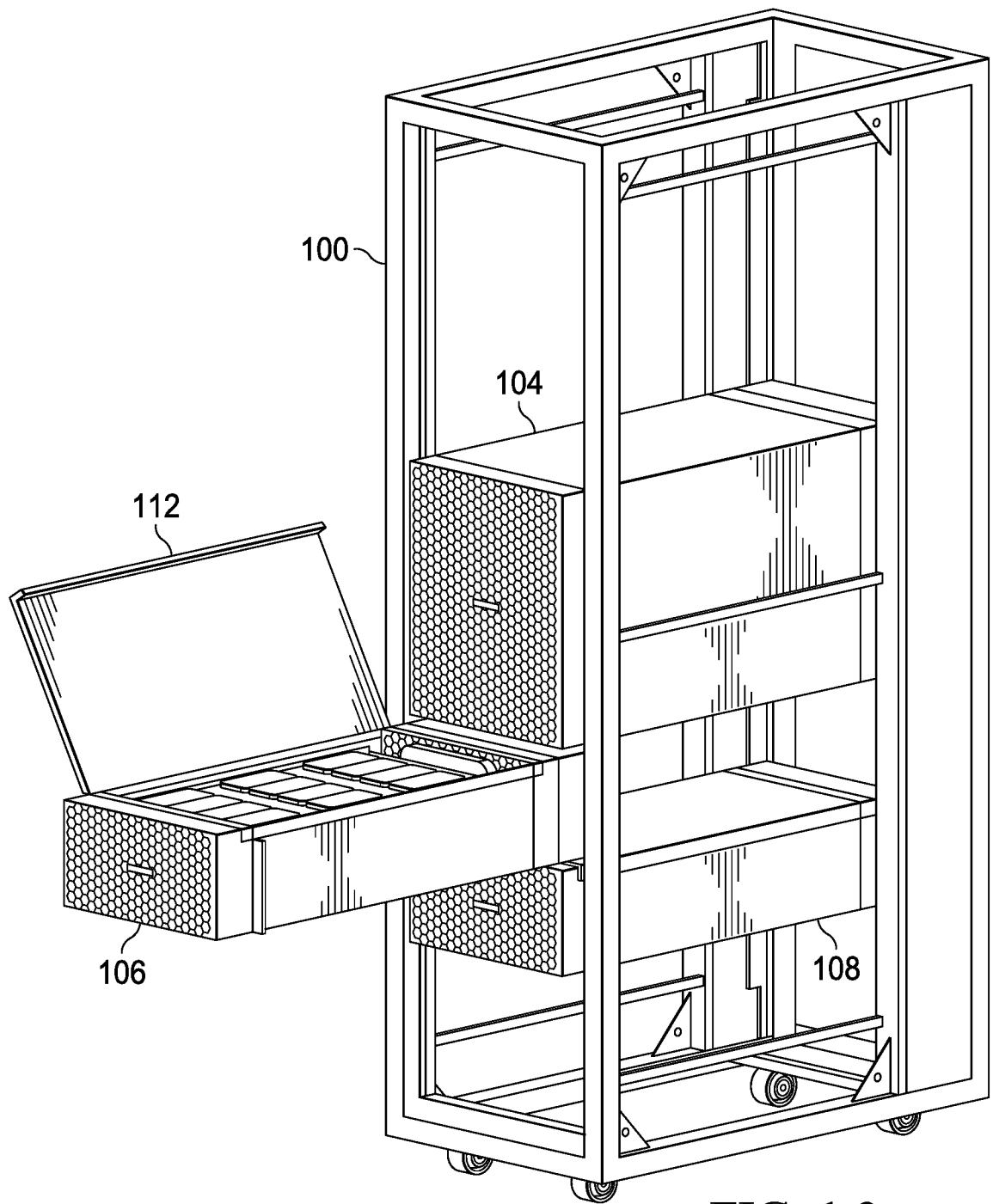
FIG. 1.3

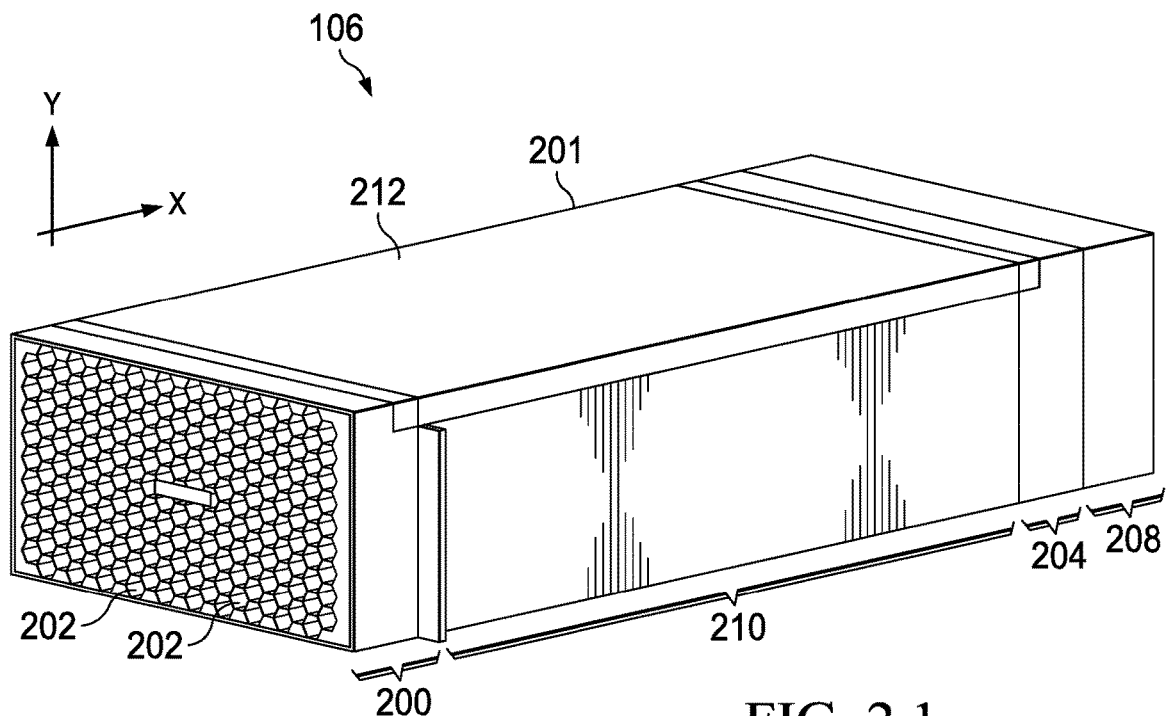
FIG. 2.1
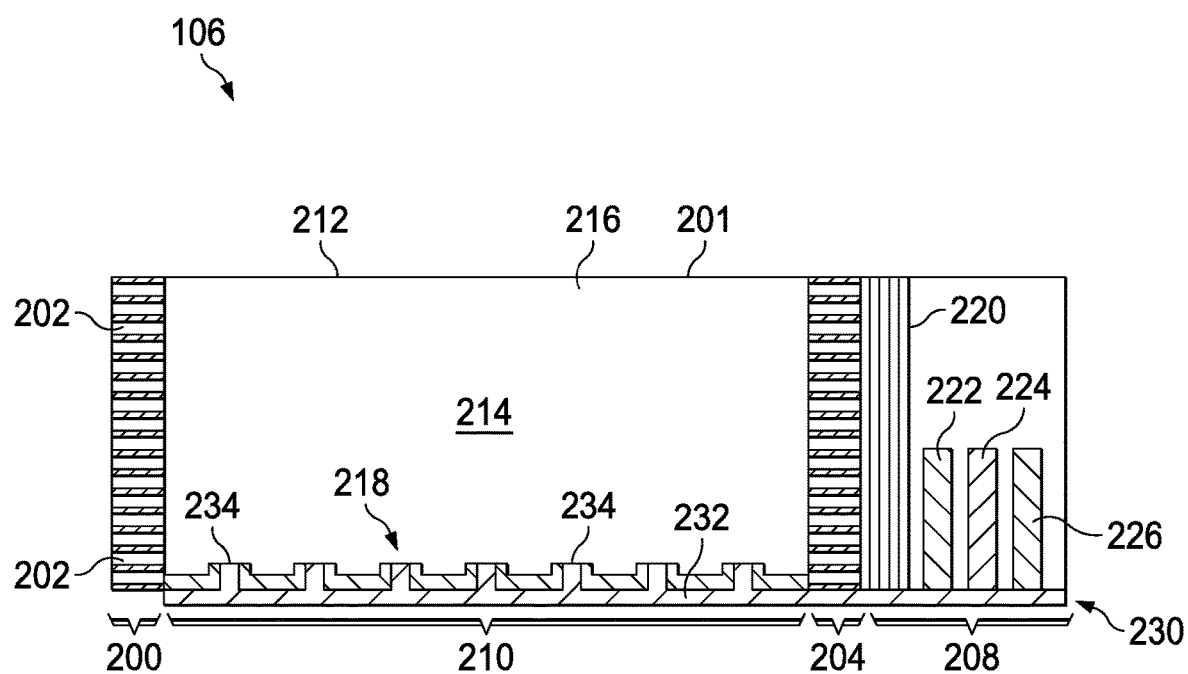
FIG. 2.2

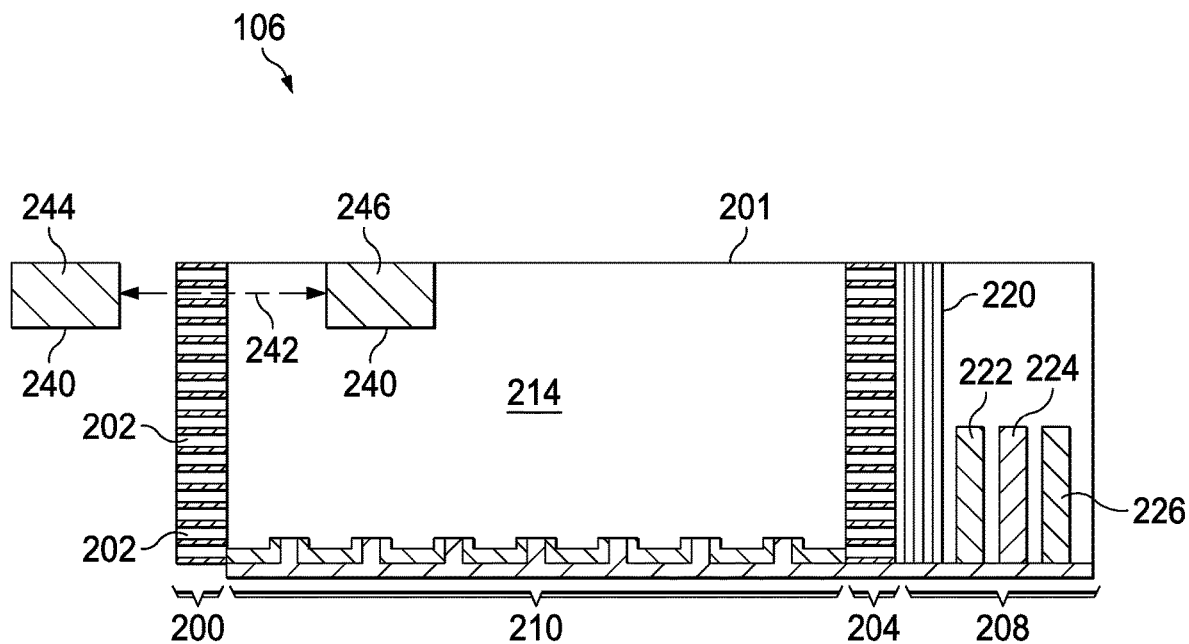
FIG. 2.3
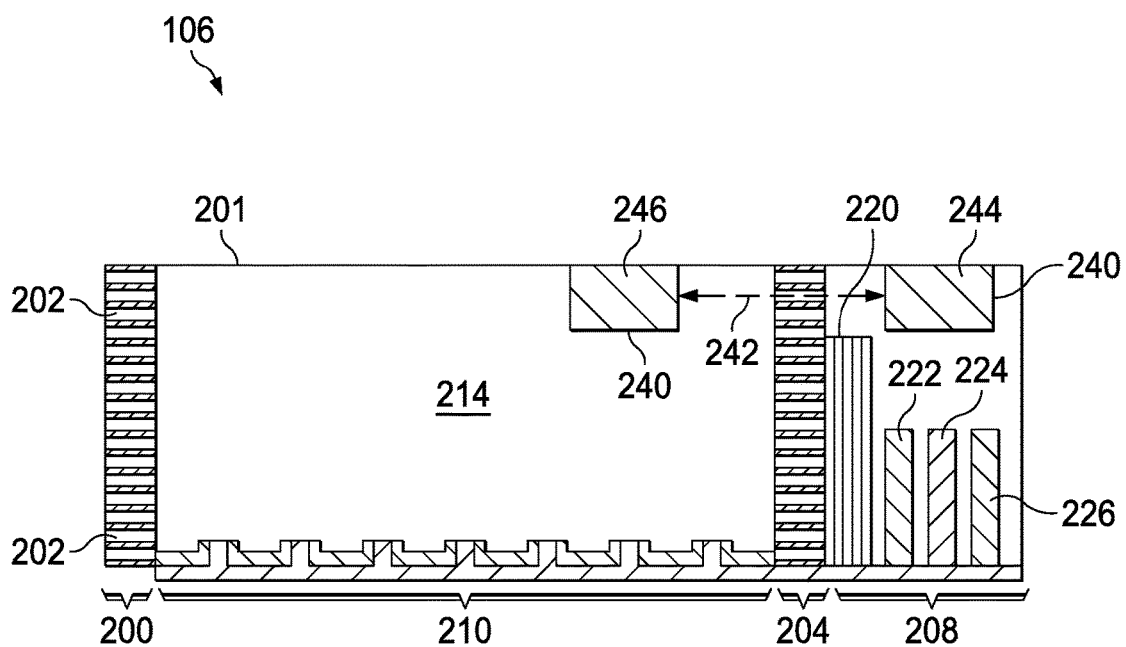
FIG. 2.4

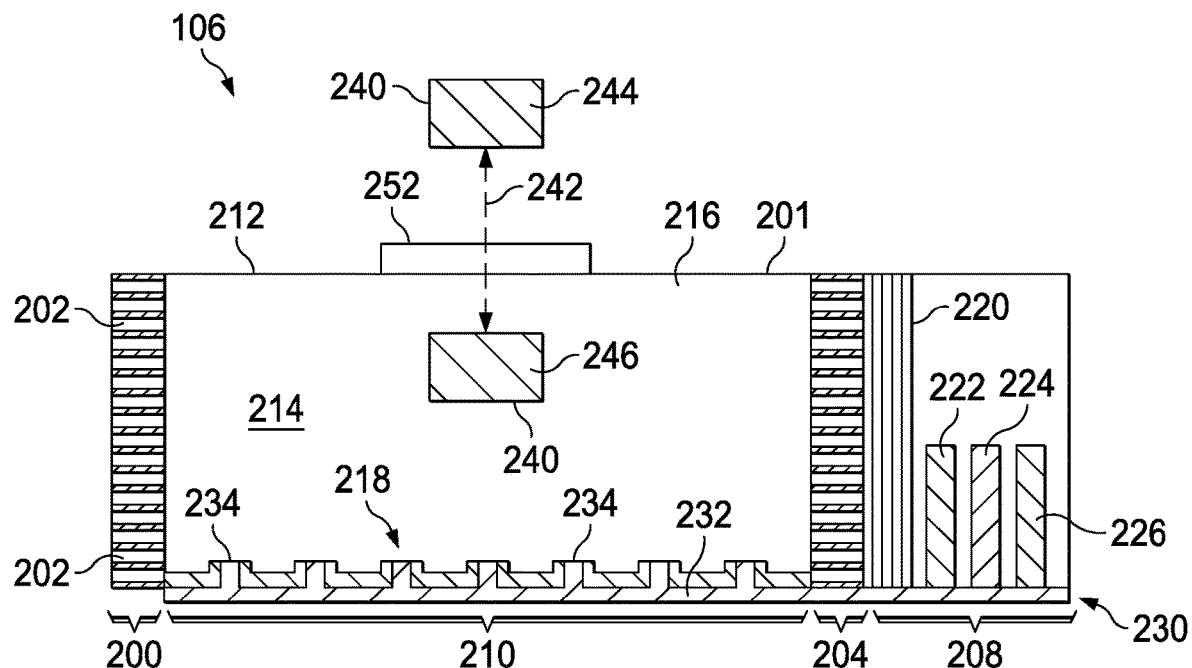
FIG. 2.5
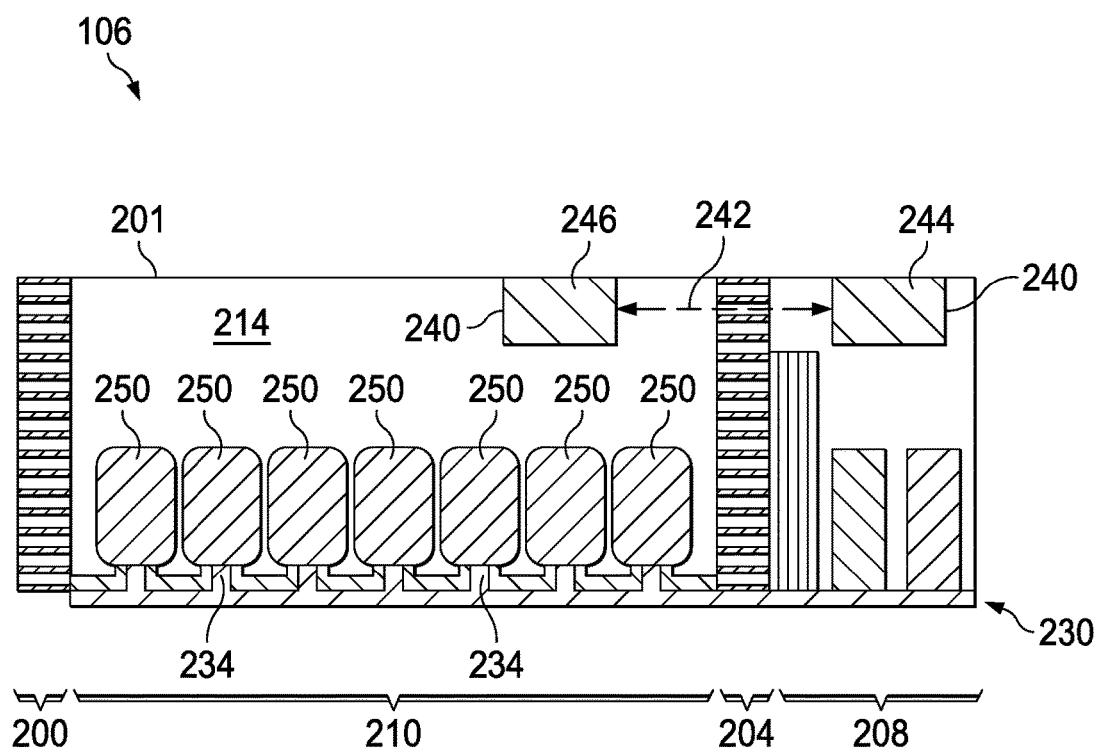
FIG. 2.6

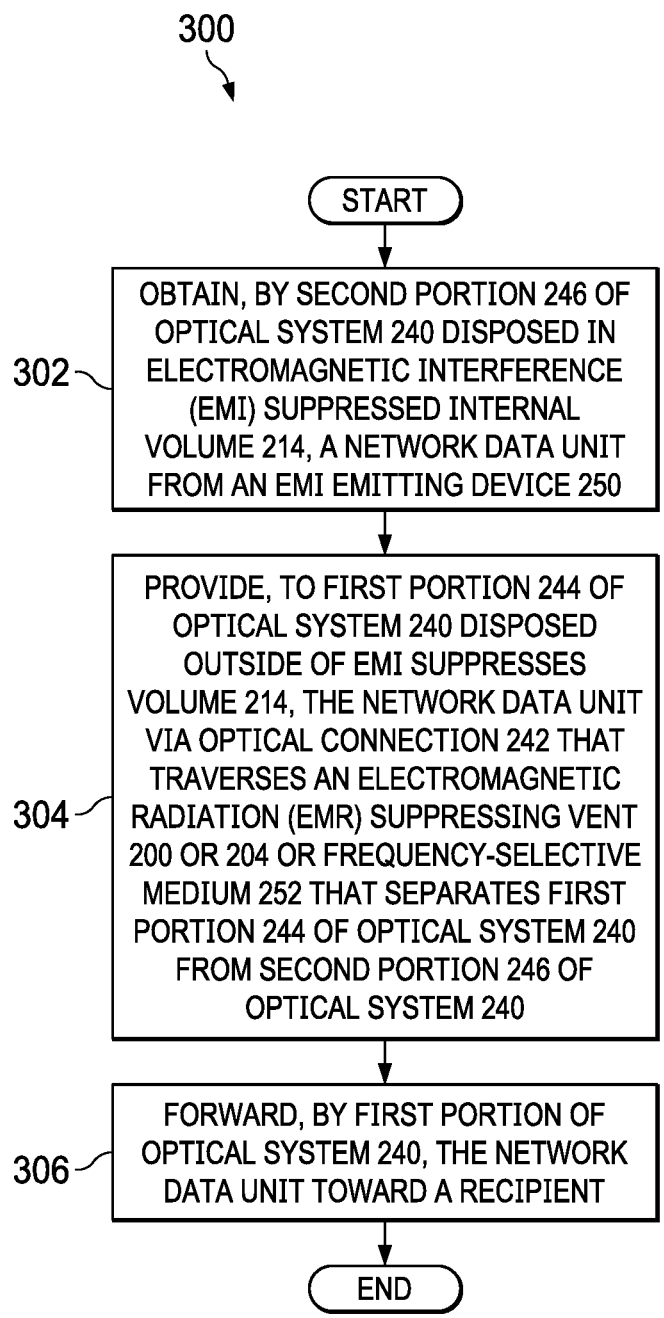
FIG. 3.1

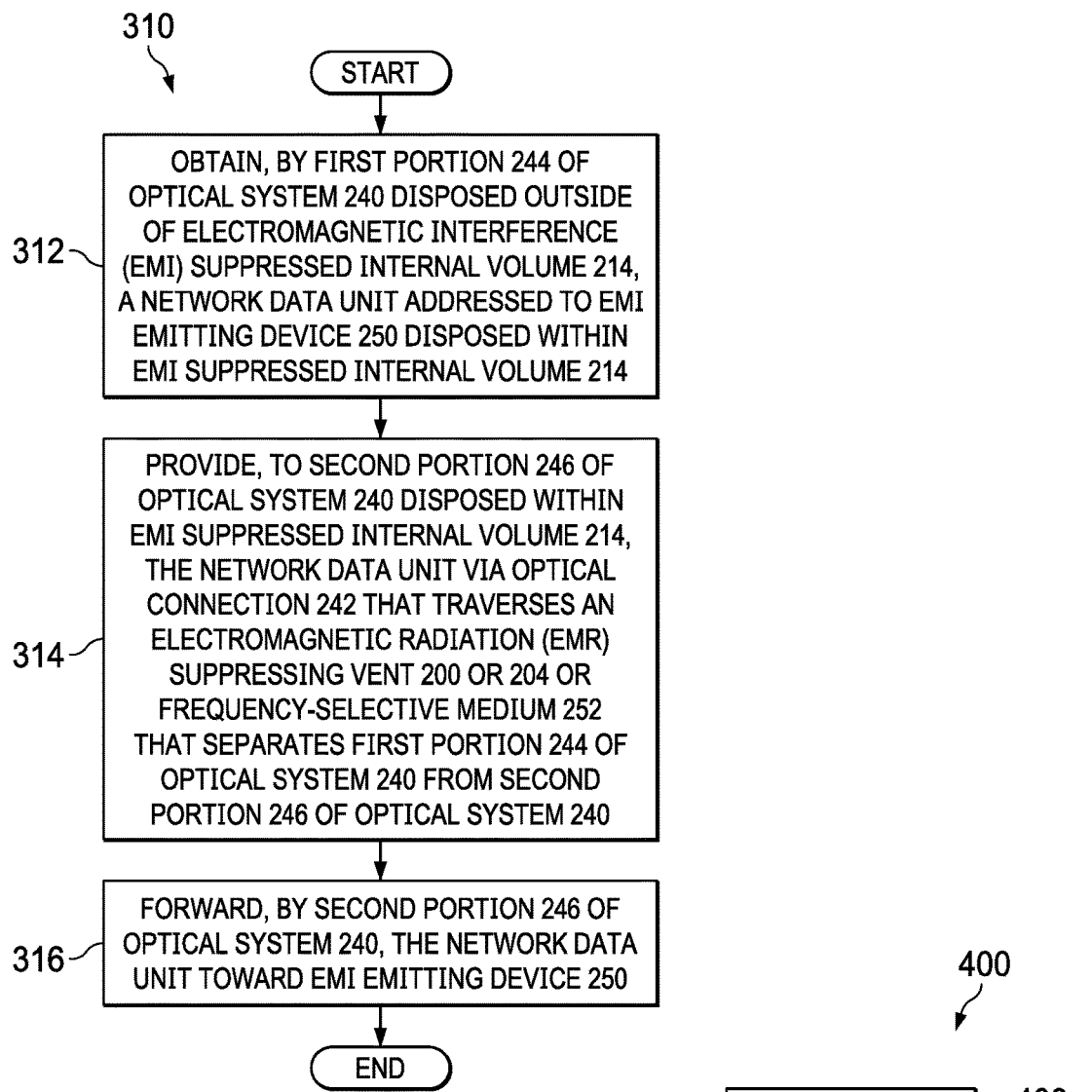
FIG. 3.2
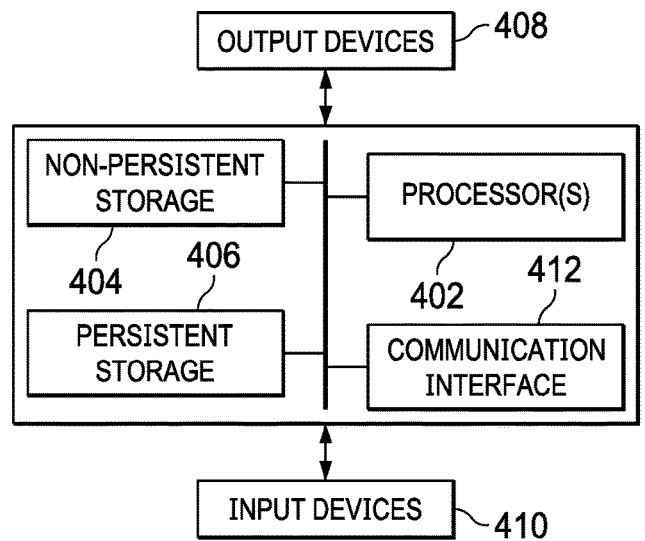
FIG. 4

SYSTEMS AND METHODS FOR COMMUNICATING EXTERNALLY FROM A SEALED VOLUME

TECHNICAL FIELD

The present disclosure relates to information handling systems. More specifically, embodiments of this disclosure may relate to systems and methods for communicating externally from a sealed volume, including an electromagnetic interference suppressed volume and a fluidically-sealed volume.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

A high-density environment may include multiple devices that are highly-packed together. In other words, the devices may be physically close to one another. Such an environment may present multiple challenges relating to thermal management, mechanical positioning and orienting of devices, and electrical concerns related to power and operation of such devices.

SUMMARY

In accordance with the teachings of the present disclosure, the disadvantages and problems associated with externally communicating to a sealed volume may be substantially reduced or eliminated.

In accordance with embodiments of the present disclosure, a data processing device may include an internal volume that is sealed from space outside the internal volume and an optical system. The optical system may include a first portion, disposed in the internal volume, adapted to receive network data units from devices disposed in the internal volume and a second portion of the optical system. The optical system may also include the second portion, disposed outside of the internal volume, adapted to obtain the network data units from the first portion via an optical connection using transmission at optical frequencies.

In accordance with these and other embodiments of the present disclosure, a method may include obtaining, by a first portion of an optical system disposed in a sealed internal volume of a data processing device, a network data unit from a device from one or more devices disposed in the internal volume. The method may also include providing, to a second portion of the optical system disposed outside of the sealed internal volume, the network data unit via an optical connection using transmission at optical frequencies. The method may further include forwarding, by the second portion of the optical system, the network data unit towards a recipient.

In accordance with these and other embodiments of the present disclosure, a non-transitory computer readable medium may include instructions that when executed by a data processing device may cause the data processing device to perform a method. The method may include obtaining, by a first portion of an optical system disposed in a sealed internal volume of a data processing device, a network data unit from a device from one or more devices disposed in the internal volume. The method may also include providing, to a second portion of the optical system disposed outside of the sealed internal volume, the network data unit via an optical connection using transmission at optical frequencies. The method may further include forwarding, by the second portion of the optical system, the network data unit towards a recipient.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 1.1 illustrates a diagram of an example system in accordance with embodiments of the present disclosure;

FIG. 1.2 illustrates a diagram of the example system of FIG. 1.1 in a first configuration in accordance with embodiments of the present disclosure;

FIG. 1.3 illustrates a diagram of the example system of FIG. 1.1 in a second configuration in accordance with embodiments of the present disclosure;

FIG. 2.1 illustrates a diagram of a second data processing device in accordance with embodiments of the present disclosure;

FIG. 2.2 illustrates a first cross section diagram of the data processing device of FIG. 2.1 in accordance with embodiments of the present disclosure;

FIG. 2.3 illustrates a second cross section diagram of the data processing device of FIG. 2.1 including an optical system positioned near a front vent, in accordance with embodiments of the present disclosure;

FIG. 2.4 illustrates a third cross section diagram of the data processing device of FIG. 2.1 including an optical system positioned near a rear vent, in accordance with embodiments of the present disclosure;

FIG. 2.5 illustrates a fourth cross section diagram of the data processing device of FIG. 2.1 including an optical system positioned near a frequency-selective medium, in accordance with embodiments of the present disclosure;

FIG. 2.6 illustrates the third cross section diagram of the data processing device of FIG. 2.4 in a state where the data processing device has been loaded with electromagnetic interference emitting devices, in accordance with embodiments of the present disclosure;

FIG. 3.1 illustrates a flowchart of a method for facilitating communications between devices disposed in a sealed volume, in accordance with embodiments of the present disclosure;

FIG. 3.2 illustrates a flowchart of a method of facilitating communications between devices disposed in a sealed volume, in accordance with embodiments of the present disclosure; and FIG. 4 illustrates a diagram of an example information handling system, in accordance with embodiments of the present disclosure.

DETAILED DESCRIPTION

Preferred embodiments and their advantages are best understood by reference to FIGS. 1 through 4, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more busses operable to transmit communication between the various hardware components.

In this disclosure, the term "information handling resource" may broadly refer to any component system, device or apparatus of an information handling system, including without limitation processors, buses, memories, input-output devices and/or interfaces, storage resources, network interfaces, motherboards, electro-mechanical devices (e.g., fans), displays, and power supplies.

FIG. 1.1 illustrates an example system, in accordance with embodiments of the present disclosure. The system may include a frame 100 and any number of data processing devices 102. The components of the example system may provide electromagnetic interference management services for devices disposed within data processing devices 102. By doing so, devices that emit electromagnetic interference may be utilized in a high-density computing environment without negatively impacting the high-density computing environment.

For example, one or more electromagnetic interference emitting devices may be disposed within one or more of data processing devices 102. The system illustrated in FIG. 1.1 may manage the electromagnetic interference generated by the one or more electromagnetic interference emitting devices by (i) limiting the space in which electromagnetic interference is allowed to freely propagate and/or (ii) attenuating the electromagnetic interference as it propagates out of the limited space.

To do so, the system of FIG. 1.1 may reduce the strength of the electromagnetic interference when propagating from inside of a portion of data processing devices 102 to an ambient environment (or other portions of data processing devices 102) around data processing devices 102 and/or other locations by at least 90 decibels (or another suitable level).

The electromagnetic interference isolation provided by data processing devices 102 may have a frequency dependent response. For example, data processing devices 102 may provide at least 90 decibels (dB), or another suitable level of isolation, across a frequency band in which devices that may be disposed within data processing devices 102 are adapted to emit electromagnetic interference. In other frequency bands, data processing devices 102 may provide a different level or no electromagnetic interference isolation for devices disposed within data processing devices 102.

Accordingly, a data processing device 102 in accordance with embodiments of this disclosure may provide electromagnetic interference suppression services that are frequency dependent. In embodiments of this disclosure, a data processing device 102 may provide electromagnetic interference isolation by reducing the strength of electromagnetic interference across at least one frequency band by a predetermined amount (e.g., 90 decibels).

An electromagnetic interference emitting device may be any type of hardware device that intentionally emits electromagnetic radiation as part of its operation. The emissions of electromagnetic radiation may be, for example, continuous, periodic, or intermittent (e.g., at any point in time based on the operation of the respective electromagnetic interference emitting device). An electromagnetic interference emitting device may be, for example, a personal electronic device such as a cellular device (e.g., smart phone, cell phone, etc.), a personal computer (e.g., any type of computing device with wireless communication capabilities such as a tablet computer, a laptop computer, etc.), a watch (e.g., a wireless smart watch), or any other type of hardware device that intentionally emits electromagnetic radiation for any purpose (e.g., communications, detection, etc.).

The electromagnetic interference emitted by an electromagnetic interference emitting device may be frequency dependent. That is, the electromagnetic interference emitted by the electromagnetic interference emitting device may be stronger in a first frequency band and weaker in a second frequency band. To provide electromagnetic interference suppression services, a data processing device 102 in accordance with this disclosure may attenuate the electromagnetic interference emitted by an electromagnetic interference emitting device by at least a predetermined amount (e.g., 80 decibels) across at least one frequency band in which the electromagnetic interference emitting device emits electromagnetic interference. The at least one frequency band may be, for example, the frequency band in which the emitted electromagnetic interference has a largest magnitude.

In embodiments of this disclosure, an electromagnetic interference emitting device may emit electromagnetic interference having frequency content between 700 megahertz and 10 gigahertz. An electromagnetic interference emitting device may emit electromagnetic interference having different frequency content without departing from this disclosure.

In embodiments of this disclosure, frame 100 may be a physical structure. The physical structure may be adapted to facilitate storage of data processing devices 102 in a high-density computing environment. The high-density computing environment may be, for example, a data center or another type of location where multiple data processing devices are located. To facilitate storage of data processing devices 102, frame 100 may include any number of structural members (e.g., beams, brackets, bars, etc.) and any number of mechanical mounting points (e.g., holes, threaded portions, etc.) disposed on the structural members to facilitate storage of data processing devices 102.

Different structural members may have different shapes, sizes, and/or other physical characteristics. The shapes, sizes, and/or other physical characteristics of the structural members may be adapted to enable the structural members to be mechanically coupled (e.g., permanently or reversibly coupled) to each other to form a predetermined structure. The predetermined structure may be, for example, a cage, box, or other type of structure that facilitates positioning and/or orienting data processing devices 102.

When all, or a portion, of the structural members are mechanically coupled to each other, the mechanical mounting points may be disposed at predetermined locations. The predetermined locations may correspond to similar predetermination locations on data processing devices 102 where mechanical mounting elements, complementary to the mechanical mounting point, are disposed. By doing so, frame 100 and data processing devices 102 may be adapted to position data processing devices 102 in locations and/or orientations compatible with a high-density computing environment, or another environment in which data processing devices 102 may be located.

The mechanical mounting points may be any type of physical structure for attaching (permanently or reversibly) data processing devices 102 to frame 100. There may be any number of mechanical mounting points to facilitate the attachment of any number of data processing devices.

Frame 100 may be implemented using any number of suitable materials. For example, portions of frame 100 may be implemented using metals (e.g., steel, aluminum, etc.). In another example, portions of frame 100 may be implemented using polymers (e.g., polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of frame 100 may be implemented using rubber (e.g., latex, styrene-butadiene rubbers, etc.). Frame 100 may be implemented using any quantity and combination of suitable materials without departing from this disclosure.

In one or more embodiments of this disclosure, data processing devices 102 are physical structures. For example, data processing devices 102 may include a chassis and one or more information handling systems disposed within the chassis.

A chassis may be a mechanical device that is adapted to (i) facilitate attachment of data processing device 102 to frame 100, (ii) house the one or more computing devices, (iii) house one or more electromagnetic interference emitting devices, and/or (iv) provide thermal management services to the computing devices and/or the electromagnetic interference emitting devices. For example, a chassis may be a frame mountable structure (e.g., a rectangular box) that includes internal space that may be used to house computing devices and/or electromagnetic interference emitting devices. Thus, the chassis may be a frame mountable chassis.

The chassis may be implemented using any number of suitable materials. For example, portions of the chassis may be implemented using metals (e.g., steel, aluminum, etc.). In another example, portions of the chassis may be implemented using polymers (e.g., polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of the chassis may be implemented using rubber (e.g., latex, styrene-butadiene rubbers, etc.) The chassis may be implemented using any quantity and combination of suitable materials without departing from this disclosure.

To facilitate attachment of a data processing device 102 to frame 100, the chassis may include any number of mechanical mounting elements. The mechanical mounting elements may be located at predetermined locations. The predetermined locations may correspond to similar predetermination locations on frame 100 where mechanical mounting points, complementary to the mechanical mounting elements, are disposed.

For example, a mechanical mounting element may be a rail disposed on a side of a chassis of a data processing device. The location of the rail may correspond to a position on frame 100 where a rail guide (e.g., a complementary mechanical mounting point) is disposed. The rail and the rail guide may facilitate attachment of a data processing device 102 to frame 100 which, in turn, positions and orients the data processing device 102 relative to frame 100.

To house the one or more computing devices, the chassis may include one or more internal volumes. The internal volumes may facilitate disposing of the one or more computing devices (and/or other devices such as electromagnetic interference emitting devices) within a data processing device.

To house the one or more electromagnetic interference emitting devices, the chassis may include one or more internal volumes. The internal volumes may have a shape or other characteristic(s) that facilitates disposing of the one or more electromagnetic interference emitting devices within the data processing device. For example, an internal volume of the chassis may be a rectangular void capable of housing one or more electromagnetic interference emitting devices.

In one or more embodiments of this disclosure, the one or more internal volumes of the data processing devices are adapted to restrict propagation of electromagnetic interference emitted by the electromagnetic interference emitting devices (and/or other devices such as computing devices). For example, one or more portions of the chassis that bound the one or more internal volumes may be made of metal of a predetermined thickness to prevent and/or limit transmission of electromagnetic interference through the one or more portions of the chassis. By doing so, the electromagnetic interference generated by the electromagnetic interference emitting devices may be prevented (or at least severely attenuated when leaving an internal volume) from propagating from within data processing devices 102 into the ambient environment surrounding the respective data processing devices 102.

In another example, one or more portions of the chassis that bound the one or more internal regions may be formed in a manner that filters (e.g., reflects/attenuates radiation of a certain frequency while allowing radiation of other frequencies to propagate) electromagnetic radiation when electromagnetic radiation passes through the portions of the chassis. For example, a portion of the chassis that bounds the one or more internal regions may be a waveguide filter such as an array of holes (e.g., sub-wavelength apertures corresponding to a particular frequency) in a metal sheet. By doing so, the electromagnetic interference generated by the electromagnetic interference emitting devices may be severely attenuated (e.g., attenuated by greater than 90 decibels) when propagating from within data processing devices 102 into the ambient environment surrounding the respective data processing devices 102.

In a further example, one or more portions of the chassis that bound the one or more internal regions may be made of an electromagnetic radiation attenuating material of a predetermined thickness to prevent and/or limit transmission of electromagnetic interference through the one or more portions of the chassis. The electromagnetic radiation attenuating material may be, for example, a composite of plastic or rubber that includes particulates of iron, carbonyl iron, or other electromagnetically lossy material. By doing so, the electromagnetic interference generated by the electromagnetic interference emitting devices may be severely attenuated (e.g., attenuated by greater than 90 decibels) when propagating from within data processing devices 102 into the ambient environment surrounding the respective data processing devices 102.

In yet a further example, one or more portions of the chassis that bound the one or more internal regions may be made of an electromagnetic radiation attenuating material (e.g., a specially-fabricated glass material) that does not significantly attenuate electromagnetic radiation within or near optically-visible frequencies but significantly attenuates electromagnetic radiation within the radiofrequency spectrum.

To provide thermal management services to the information handling systems and/or the electromagnetic interference emitting devices, data processing devices 102 may facilitate the flow of gas (or in some embodiments, liquid) proximate to the computing devices and/or electromagnetic interference emitting devices. By doing so, a thermal state (e.g., temperature) of the aforementioned devices may be regulated. The gas may be air or another type/combination of gases obtained from any source. In embodiments in which liquid is used, such liquid may be a dielectric liquid (e.g., an oil) which is significantly electrically non-conductive.

For example, a data processing device 102 may include one or more vents that enable gas (or liquid) from a first side of a data processing device 102 to flow into the data processing device 102, through the data processing device 102, and out of a second side of the data processing device 102. The gas (or liquid), flowing through the data processing device 102, may be at a different temperature than the information handling systems and/or electromagnetic interference emitting devices. Consequently, thermal exchange between the flow of gas (or liquid) and the aforementioned devices may occur resulting in the temperature of the aforementioned devices changing. By doing so, heat generated by the aforementioned devices may be expelled from the devices thereby regulating the temperature of the aforementioned devices.

A system in accordance with embodiments of this disclosure may include any number of data processing devices 102. Different data processing devices 102 may have different configurations and/or uses within the system.

For example, some data processing devices 102 may be adapted to house many electromagnetic interference emitting devices while other data processing devices may be primarily adapted to house information handling systems. Additional data processing devices 102 may be adapted to exclusively house information handling systems and no electromagnetic interference emitting devices. A system in accordance with embodiments of this disclosure may include any number and combination of data processing devices 102 adapted for any number of different uses without departing from this disclosure.

By way of example, the system of FIG. 1.1 may include a first data processing device 104. First data processing device 104 may be of a larger size than a second data processing device 106 and, consequently, may be capable of housing a larger number of electromagnetic interference emitting devices and/or other types of devices. The system of FIG. 1.1 may further include a third data processing device 108. In contrast to first data processing device 104 and second data processing device 106, the internal structure of third data processing device 108 may be adapted to only house information handling systems rather than electromagnetic interference generating devices.

As discussed above, data processing devices 102 may house electromagnetic interference emitting devices. When so housed, the electromagnetic interference emitting devices may operate thereby generating electromagnetic interference (e.g., electromagnetic radiation). At different points in time, it may be useful to add or remove electromagnetic interference emitting devices to or from data processing devices 102. To facilitate such additions and/or removals, different portions of data processing devices 102 may be adapted to reversibly provide access to the internal volumes of the data processing devices.

For example, the different portions of data processing devices 102 may be adapted to rotate, translate, or otherwise move with respect to the remaining portions of data processing devices 102. When the different portions of data processing devices 102 are in a first predetermination position and/or orientation, they may electromagnetically seal one or more internal volumes of data processing devices 102. That is, they may limit the extent to which electromagnetic radiation within the internal volumes is able to propagate to an ambient environment. However, when the different portions of data processing devices 102 are rotated, translated, and/or otherwise moved to a second predetermined position and/or orientation to enable access to the internal volumes, data processing devices 102 may not be electromagnetically sealed. Consequently, electromagnetic radiation within the internal volumes may be less limited by data processing devices 102 to propagate into the ambient environment when access to the internal volumes is provided.

Data processing devices 102 may include hinges, slides, knobs, and/or other mechanical devices that facilitate movement of the different portions of data processing devices 102 to reversibly reconfigure data processing devices 102 between states where access (e.g., physical accessibility) to the internal volumes of data processing devices 102 is provided and states where access to the internal volumes of data processing devices 102 is not provided. FIGS. 1.2-1.3 illustrate diagrams of data processing devices 102 facilitating the addition, modification, and/or removal of electromagnetic interference emitting devices from the internal volumes of data processing devices 102, in accordance with embodiments of the present disclosure.

While the system of FIG. 1.1 has been illustrated as including a limited number of components, a system in accordance with embodiments of this disclosure may include any number of frames 100, data processing devices 102, and/or other components without departing from this disclosure. For example, any number of frames 100 (and/or other types of physical devices for positioning/orienting devices) may be used in a high density computing environment to facilitate the placement and/or orientation of any number of data processing devices. Further, frames 100 may be used to position and/or orient other types of devices. The other types of devices may be, for example, servers, storage nodes, compute nodes, communication devices (e.g., switches, routers, etc. for facilitating communications between any number of devices and/or devices external to a high density computing environment), or any other type of device that may be used in a computing environment (e.g., data center, computing nodes, communications center, etc.). Thus, the frame and data processing devices may be used in conjunction with any number and/or type of other device without departing from this disclosure.

FIG. 1.2 shows a diagram of the example system of FIG. 1.1 in a configuration (e.g., after a reconfiguration from the configuration illustrated in FIG. 1.1) where a front vent 110 of first data processing device 104 has been opened. Front vent 110 may be opened by physically rotating and/or translating front vent 110 to move front vent 110 to a new physical location. By opening front vent 110, physical access to internal volumes of first data processing device 104 may be provided. Consequently, the internal configuration of the internal volumes of first data processing device 104 may be modified. For example, electromagnetic interference emitting devices may be removed from and/or added to the internal volumes. Similarly, computing devices may be added to and/or removed from the internal volumes.

However, in the state illustrated in FIG. 1.2, the ability of first data processing device 104 to limit propagation of and/or attenuate electromagnetic interference generated by electromagnetic interference emitting devices disposed within first data processing device 104 may be compromised. In other words, first data processing device 104 may be in an electromagnetic interference suppression compromised state that allows electromagnetic interference within internal volumes of first data processing device 104 to propagate to the ambient environment around first data processing device 104 without attenuation. In contrast, in the state illustrated in FIG. 1.1, first data processing device 104 may be in an electromagnetic interference suppressed state (e.g., electromagnetic interference generated by the electromagnetic interference emitting devices may be contained within the internal volumes and/or attenuated by greater than 90 decibels when propagating out of the internal volumes).

In some embodiments of this disclosure, first data processing device 104 may automatically cause all, or a portion, of the electromagnetic interference emitting devices disposed within its internal volumes to suspend generation of electromagnetic interference when in the electromagnetic interference suppression compromised state illustrated in FIG. 1.2. By doing so, first data processing device 104 may provide electromagnetic interference management services when first data processing device 104 is in an electromagnetic interference suppression compromised state. All, or a portion, of the data processing devices of a system in accordance with embodiments of this disclosure may provide similar electromagnetic interference management services.

Similar to FIG. 1.2, FIG. 1.3 shows a diagram of the example system of FIG. 1.1 in a second configuration (e.g., after a reconfiguration from the configuration illustrated in FIG. 1.1) where a top door 112 of second data processing device 106 has been opened after translating second data processing device 106 with respect to the frame. Top door 112 may be all, or a portion, of the chassis that may be reversibly moved to enable access to internal volumes of first data processing device 104.

To open top door 112, for example, second data processing device 106 may be mounted to frame 100 via rails that enable second data processing device 106 to translate with respect to frame 100 via application of physical force. Once translated to a predetermined location, top door 112 may be opened by application of physical force by a user.

By opening top door 112, physical access to the internal volumes of second data processing device 106 may be provided. Consequently, the internal configuration of the internal volumes of second data processing device 106 may be modified. For example, electromagnetic interference emitting devices may be removed from and/or added to the internal volumes of second data processing device 106. Similarly, computing devices may be added to and/or removed from the internal volumes of second data processing device 106.

However, in the state illustrated in FIG. 1.3, the ability of second data processing device 106 to limit propagation of and/or attenuate electromagnetic interference generated by electromagnetic interference emitting devices disposed within second data processing device 106 may be compromised. In other words, second data processing device 106 may be in an electromagnetic interference suppression compromised state that allows electromagnetic interference within internal volumes of second data processing device 106 to propagate to the ambient environment around second data processing device 106 without attenuation. In contrast, in the state illustrated in FIG. 1.1, first data processing device 104 may be in an electromagnetic interference suppressed state (e.g., electromagnetic interference generated by the electromagnetic interference emitting devices may be contained within the internal volumes and/or attenuated by greater than 90 decibels when propagating out of the internal volumes).

In some embodiments of this disclosure, second data processing device 106 may automatically cause all, or a portion, of the electromagnetic interference emitting devices disposed within its internal volumes to suspend generation of electromagnetic interference when in the electromagnetic interference suppression compromised state illustrated in FIG. 1.3. By doing so, second data processing device 106 may provide electromagnetic interference management services when second data processing device 106 is in an electromagnetic interference suppression compromised state. All, or a portion, of the data processing devices of a system in accordance with embodiments of this disclosure may provide similar electromagnetic interference management services (e.g., automatically terminating and/or resuming the electromagnetic interference generation depending on the electromagnetic interference suppression state of the data processing device).

Thus, as illustrated in FIGS. 1.1-1.3, a system in accordance with embodiments of this disclosure may provide electromagnetic interference management services to devices disposed with data processing devices 102 when data processing devices 102 are in an electromagnetic interference suppression compromised state or an electromagnetic interference suppressed state.

As discussed above, a system in accordance with one or more embodiments of this disclosure may include one or more data processing devices. FIGS. 2.1-2.5 illustrate diagrams of data processing devices 102 in accordance with embodiments of this disclosure.

FIG. 2.1 shows a diagram of second data processing device 106 in accordance with one or more embodiments of this disclosure. As discussed above, second data processing device 106 may provide electromagnetic interference management services for electromagnetic interference emitting devices disposed within second data processing device 106. In addition to electromagnetic interference management services, second data processing device 106 may provide power management services and communications services. The aforementioned services may be provided to electromagnetic interference emitting devices and/or computing devices and/or other types of devices disposed within second data processing device 106.

To do so, second data processing device 106 may include a chassis 201. Chassis 201 may be a structure that is mountable to frame 100. By being mountable to frame 100, chassis 201 may be usable in a high density environment. For example, chassis 201 may be a rail mount chassis. Chassis 201 may be mountable via other methods (e.g., using mechanical features other than rails such as bolts, screws, pins, etc.).

Chassis 201 may include a front vent 200, a rear vent 204, a support module 208, and a payload module 210.

Front vent 200 may be a physical device for (i) enabling gas flow (or liquid flow) through second data processing device 106 and (ii) limiting the propagation of electromagnetic interference from an internal volume of second data processing device 106 and/or attenuating electromagnetic interference that propagates from an internal volume of second data processing device 106 to an ambient environment around second data processing device 106 via front vent 200.

In accordance with embodiments of this disclosure, front vent 200 may reflect and/or attenuate electromagnetic radiation that is propagating from internal volume 214 to an ambient environment through front vent 200 by at least 90 decibels (or another suitable level such as, for example, 30 decibels, 45 decibels, 60 decibels, 75 decibels, etc.). By doing so, front vent 200 may delineate one of the walls of internal volume 214 to enable internal volume 214 to be electromagnetically suppressed and/or isolated by 90 decibels (or another suitable level of suppression/isolation) from the ambient environment and/or other portions of the chassis (e.g., support module 208).

In one or more embodiments of this disclosure, front vent 200 may be a rectangular structure formed with holes 202 that enable gases (or liquids) to flow between the ambient environment surrounding second data processing device 106 and an internal volume of second data processing device 106. By doing so, second data processing device 106 may provide thermal management services to components disposed within second data processing device 106 by controlling the flow of gases from the ambient environment through second data processing device 106.

For example, second data processing device 106 may be used in a high-density computing environment in which a source of cool gas (or liquid) is supplied to a first side of second data processing device 106. In such an environment, second data processing device 106 may cause the cool gas (or liquid) to flow into second data processing device 106 via front vent 200 and exhaust gas out a second side of second data processing device 106 (e.g., out of support module 208). Alternatively, second data processing device 106 may cause a reverse gas (or liquid) flow, with respect to the gas (or liquid) flow discussed above, if the source of cool gas (or liquid) is supplied proximate to support module 208 rather than proximate to front vent 200.

The structure of front vent 200 may also be adapted to limit propagation of electromagnetic radiation through front vent 200 and/or attenuate electromagnetic radiation that propagates through front vent 200. For example, the size, position, number, shape, and/or other characteristics of holes 202 through the front vent may be adapted to (i) limit propagation of electromagnetic radiation and/or (ii) attenuate propagating electromagnetic radiation. In another example, the thickness and material choice of front vent 200 may be adapted to (i) limit propagation of electromagnetic radiation and/or (ii) attenuate propagating electromagnetic radiation. By being so adapted, front vent 200 may attenuate electromagnetic radiation that propagates through front vent 200 by at least 90 decibels or another desirable quantity (e.g., 30 decibels, 45 decibels, 60 decibels, 75 decibels, 120 decibels, etc.).

To facilitate the flow of gas (or liquid) between the ambient environment and the internal volume of second data processing device 106, the size, position, number, shape, and/or other characteristics of holes 202 may be selected to meet gas flow (or liquid flow) requirements for thermal management purposes while providing electromagnetic interference suppression characteristics.

In one or more embodiments of this disclosure, rear vent 204 is similar to front vent 200. For example, rear vent 204 may provide similar attenuation and/or restriction of propagation of electromagnetic radiation while enabling gases to flow between internal volumes of second data processing device 106. Rear vent 204 may have a similar structure to that of front vent 200. However, the structure (e.g., different hole pattern, thickness, hole type, etc.) and/or electromagnetic (e.g., attenuation and/or reflection of electromagnetic radiation) and/or hydrodynamic (e.g., impedance to fluid flow) characteristics of rear vent 204 may be different from front vent 200 without departing from this disclosure.

Payload module 210 may be a physical device for (i) housing electromagnetic interference devices, (ii) limiting propagation of electromagnetic interference from internal volumes of second data processing device 106 to the ambient environment surrounding second data processing device 106, and (iii) thermally regulating devices disposed within payload module 210. Payload module 210 is described in greater detail below with reference to FIG. 2.2.

Support module 208 may be a physical device for housing devices that provide services to devices disposed within payload module 210. For example, support module 208 may house one or more power supplies (e.g., a power system), fans (e.g., a thermal management system), networking devices (e.g., a communication system), and/or information handling systems. The aforementioned devices may provide corresponding services to devices disposed in other portions of second data processing device 106 and/or devices located in other locations (e.g., external to second data processing device 106).

In one or more embodiments of this disclosure, support module 208 may not provide electromagnetic interference management services to devices disposed within support module 208, in contrast to payload module 210. For example, support module 208 may not intentionally isolate electromagnetic interference generated by devices disposed within support module 208 from the ambient environment surrounding second data processing device 106. Intentionally isolating electromagnetic interference means that the structure of a physical structure is adapted to provide such isolation. While many types of physical structures may provide some degree of electromagnetic interference isolation as an inherent consequence of their existence, the electromagnetic interference isolation is not intended. Rather, the physical structures may exist for their other properties such as mechanical strength while providing some degree (albeit low) of electromagnetic interference isolation. Thus, while support module 208 may to some degree electromagnetically separate devices disposed within support module 208 from the ambient environment, support module 208 does not provide electromagnetic interference management services. Providing electromagnetic interference management services may refer to providing at least 20 decibels of attenuation.

In one or more embodiments of this disclosure, providing electromagnetic interference management services may reduce the strength of electromagnetic radiation by at least 20 decibels when the electromagnetic radiation propagates from an internal volume of a data processing device to an ambient environment outside of the data processing device.

The one or more power supplies may supply power to other devices. For example, the power supplies may provide power to electromagnetic interference emitting devices disposed within payload module 210, other types of devices (e.g., computing device) disposed within payload module 210, and/or devices located in other areas.

The one or more power fans may provide thermal management services to other devices. For example, the fans may regulate the flow of gases through the second data processing device and, consequently, manage the thermal state of electromagnetic interference emitting devices and/or other types of devices disposed in payload module 210 and/or support module 208. In embodiments that employ liquid cooling, pumps or other devices for driving liquid flow may be used in lieu of fans.

The one or more power networking devices may provide communication services to other devices (e.g., providing network services). For example, the networking devices may manage network interfaces that enable second data processing device 106 to communicate with other devices (e.g., information handling systems that may be controlling the operation of the electromagnetic interference emitting devices).

The one or more information handling systems may manage the operations of the other entities of second data processing device 106. For example, the information handling systems may send messages to the electromagnetic interference emitting devices to perform predetermined functionality. Such messages, when received by the electromagnetic interference emitting devices, may cause the electromagnetic interference emitting devices to stop and/or start emitting electromagnetic interference (and/or perform other actions).

The information handling systems may send such instructions when (or around the time when) the electromagnetic interference suppression state of second data processing device 106 is changed (e.g., when portions of second data processing device 106 are physically reconfigured). The information handling systems may make such determinations based on any number of sensors (not shown) that monitor the physical configuration of second data processing device 106. The sensors may be disposed, for example, in payload module 210, on vents 200 and/or 204, and/or at other locations such that measurements by the sensors indicate the thermal state of components of second data processing device 106 for which thermal management services (e.g., monitoring the thermal state of components and taking actions such as modifying the rate of gas flow (or temperature of cooling liquid) to manage the thermal state of the components) are being provided.

In another example, the information handling systems may send messages to fan controllers (not shown) or other devices that manage the operation of gas flow control devices disposed within second data processing device 106. The information handling systems may send such messages based on the thermal state (e.g., temperature) of one or more devices disposed within second data processing device 106. The information handling systems may monitor such thermal states using any number of sensors (not shown) and/or based on messages received from the one or more devices disposed within second data processing device 106. In response to receipt of such messages, the fan controllers or other devices may modify the operational state of the gas flow control devices. By doing so, the computing devices may change the thermal state of devices disposed within second data processing device 106 by controlling the flow of gases (or liquids) through second data processing device 106.

To manage the operation of the other entities of second data processing device 106, one or more processors of the information handling systems may execute instructions (e.g., computer code), stored on a persistent storage, that may cause the information handling systems to perform all, or a portion, of the methods illustrated in FIGS. 3.1 and 3.2. Further details of information handling systems may be provided with reference to FIG. 4, below.

FIG. 2.2 illustrates a first cross section diagram of data processing device 106 of FIG. 2.1 in accordance with embodiments of the present disclosure. In FIG. 2.2, the cross section may be taken along the X-Y plane illustrated in FIG. 2.1.

As shown in FIG. 2.2, payload module 210 may include an internal volume 214. Internal volume 214 may be used to house devices such as electromagnetic interference emitting devices, supports for such devices, and/or other devices that may provide services to the electromagnetic interference emitting devices and/or other devices.

Internal volume 214 may be bounded, on four sides, by portions of payload module 210. For example, internal volume 214 may be bounded by a top door 212, a bottom 218, a first side 216, and a second side (not shown). These four components of payload module 210 may define a rectangular shape of internal volume 214.

Internal volume 214 may be further bounded, on a fifth and sixth size, by front vent 200 and rear vent 204. Front vent 200 and rear vent 204 may be on opposite sides of internal volume 214. By doing so, front vent 200 and rear vent 204 may define a gas flow (or liquid flow) path through payload module 210. For example, gases (or liquids) may be able to flow from between the two vents through internal volume 214.

As discussed above, second data processing device 106 may control gas flows disposed within second data processing device 106 to provide thermal management services. To do so, second data processing device 106 may include a thermal management system 220. Thermal management system 220 may include (i) flow control devices, (ii) temperature sensors, and/or (iii) a controller.

The controller may operate the flow control devices based on temperature information obtained from the temperature sensors and/or temperature information obtained from other devices (e.g., from electromagnetic interference emitting devices). For example, the controller may increase the flow rate of a gas (or liquid) flow within second data processing device 106 to manage the temperature of one or more devices within a predetermined range.

The flow control devices may be, for example, fans or other types of active devices for controlling the flow of gases, or pumps or other types of active devices for controlling the flow of liquids. Thermal management system 220 may include any number of flow control devices without departing from this disclosure.

Second data processing device 106 may also include a power system 222. Power system 222 may provide power to any number and/or type of devices disposed within the second data processing device. For example, the power system 222 may provide power to electromagnetic interference emitting devices disposed within payload module 210, thermal management system 220, a communication system 224, and/or information handling system 226.

To perform such functionality, power system 222 may include, for example, one or more power supplies, regulators, controllers, and/or other types of components for providing power. The aforementioned components may identify components to which power is to be supplied, identify a quantity of power to supply to each of the components, and/or provide the power to each of the respective components. As discussed in greater detail below, power system 222 may provide power using an interconnect 230.

The second data processing device may further include a communication system 224. Communication system 224 may provide communication services. As discussed above, due to the electromagnetic interference isolation provided by second data processing device 106, components disposed within payload module 210 may be unable to utilize the services provided by communication system 224. Consequently, a second communication system, at least partially disposed within payload module 210, may be present in one or more embodiments of this disclosure. Examples of such a communication system are further described below with reference to FIGS. 2.3-2.5, below.

Communication system 224 may include, for example, one or more transceivers, communication processors, and/or other types of components for providing communication services. The aforementioned components may provide the communication services. The communication services may include, for example, exchanging network data units with electromagnetic interference emitting devices disposed in the payload module, an information handling system 226 disposed in support module 208, and/or other devices disposed outside of second data processing device 106. By doing so, the aforementioned devices may communicate with one another via information included in the exchanged network data units. A network data unit may be a communication supported by a communication protocol that enables information to be transmitted. A network data unit may be, for example, a packet in the event that an internet protocol is utilized. As will be discussed in greater detail below, communication system 224 may provide the communication services using an interconnect 230.

Information handling system 226 may manage the operation of the components of the second data processing device. For example, information handling system 226 may manage thermal management system 220, power system 222, communication system 224, and/or other components (such as electromagnetic interference emitting devices) disposed within the second data processing device. To manage the other devices, information handling system 226 may use the communication services provided by communication system 224 as well as interconnect 230.

Interconnect 230 may be a physical device for providing operable connections between devices disposed within second data processing device 106. Interconnect 230 may support distribution of power by power system 222 to any number of devices disposed within payload module 210, support module 208, and/or other locations. For example, interconnect 230 may include a set of wires that physically interconnect devices disposed within second data processing device 106.

In one or more embodiments of this disclosure, interconnect 230 may facilitate distribution of power to electromagnetic interference emitting devices disposed within payload module 210 while the electromagnetic interference emitting devices are isolated. By doing so, the electromagnetic interference emitting devices may be provided power without negatively impacting the operation of other devices due to electromagnetic interference generated by the electromagnetic interference emitting devices.

Accordingly, second data processing device 106 may include a backplane 232. Backplane 232 may electromagnetically isolate interconnect 230 from the internal volume of payload module 210. For example, backplane 232 may be a metal sheet of sufficient thickness to prevent electromagnetic interference from penetrating through backplane 232. Backplane 232 may include any number of feedthroughs 234. Feedthroughs 234 may be physical devices that enable interconnect 230 to physically couple to any number of devices disposed within payload module 210.

FIG. 2.3 illustrates a second cross section diagram of data processing device 106 of FIG. 2.1 including an optical system 240 positioned near front vent 200 in accordance with embodiments of the present disclosure. Optical system 240 may facilitate communications from within internal volume 214 and an ambient environment external to chassis 201. Optical system 240 may be an optical communications system that enables one or more devices disposed within payload module 210 to communicate with devices disposed outside of payload module 210. As discussed above, payload module 210 may include an internal volume 214 that is electromagnetically isolated from the ambient environment and/or other portions of the data processing device. Consequently, electromagnetic interference emitting devices and/or other types of devices disposed within the internal volume may be unable to communicate with devices outside of the internal volume absent optical system 240.

Optical system 240 may include two portions. First portion 244 may be disposed outside of internal volume 214 of payload module 210 and second portion 246 may be disposed inside of internal volume 214. First portion 244 and second portion 246 may be physically separated by front vent 200.

Each of the portions 244, 246 may be physical devices that facilitate optical communications between the respective portions 244, 246 and/or other entities. For example, each of the portions 244, 246 may include optical transceivers, network data unit processors, and/or other types of components to facilitate optical communications.

The optical transceivers may be physical devices that generate optical signals onto which data is encoded. For example, the optical transceivers may include modulators, power amplifiers, and digital signal processors to generate an optical signal upon which data has been encoded. Optical transceivers may also include an optical source (e.g., laser, infrared lamp, etc.) and/or an optical detector (e.g., photodetector). The optical transceivers may be any type of optical transceiver without departing from this disclosure.

Each of portions 244, 246 of optical system 240 may be oriented along the path indicated by optical connection 242 illustrated as a dashed line terminating in double arrows. Optical connection 242 may comprise a line-of-sight path between first portion 244 and second portion 246 via a hole 202 of front vent 200. Accordingly, a transmission path for electromagnetic radiation (in the form of visible or near-visible light) that traverses through front vent 200 may be formed. Thus, when optical signals are generated by either of the optical transceivers, the optical signals along an optical line-of-sight transmission path that traverses through front vent 200.

In one or more embodiments of this disclosure, the optical transceivers may be adapted to operate in a frequency band (e.g., visible or near-visible light) that is outside of the frequency band in which electromagnetic interference emitting devices generate electromagnetic radiation (e.g., in radiofrequency ranges). For example, in a particular example, the electromagnetic interference emitting devices may be personal electronic devices that emit electromagnetic radiation at 2.4 GHz. In such a scenario, the optical transceivers in portions 244, 246 may be adapted to operate in an optical frequency band (e.g., 100 GHz or more) orders of magnitude higher than the 2.4-GHz band.

In the present embodiment, "optical frequencies" is used to denote those frequencies of electromagnetic radiation that include not only visible wavelengths of light, but also those electromagnetic radiation that include near-visible wavelengths of light, including infrared and ultraviolet electromagnetic radiation.

In one or more embodiments of this disclosure, optical transceivers may be adapted to operate in a frequency band that is outside of the frequency band in which front vent 200 provides electromagnetic interference suppression services. As discussed above, front vent 200 may prevent and/or attenuate propagation of electromagnetic radiation from the internal volume to the ambient environment. However, front vent 200 may only prevent and/or attenuate propagation of electromagnetic radiation within a predetermined frequency band. For example, front vent 200 may have a band reject frequency response with respect to electromagnetic radiation. Front vent 200 may reflect and/or attenuate electromagnetic radiation that attempts to propagate through front vent 200 within a predetermined frequency range. The predetermined frequency range may correspond to the frequency range in which electromagnetic interference emitting devices radiate electromagnetic radiation when operating.

In one or more embodiments of this disclosure, the network data unit processors of optical system 240 may be adapted to receive network data units, make a determination with respect to where to send network data units, and forward the network data units accordingly. For example, an electromagnetic interference emitting device disposed within payload module 210 may send a network data unit to second portion 246 for forwarding to a remote entity (not shown). In response to receiving the network data unit, second portion 246 may transmit the network data unit to first portion 244 using optical connection 242. Once received, a packet processor of first portion 244 may analyze the network data unit and make a determination with respect to where to send the network data unit.

While not expressly illustrated in FIG. 2.3, first portion 244 may be operably coupled to any number of other entities via any combination of wired, wireless, and/or optical networks. Thus, first portion 244 of optical system 240 may facilitate forwarding of network data units to any number of remote entities (not expressly shown).

While not expressly illustrated in FIG. 2.3, second portion 246 may be operably coupled to any number of devices disposed within internal volume 214 of payload module 210. The operable couplings may be implemented using any combination of wired, wireless, and/or optical networks. For example, an electromagnetic interference emitting device disposed within payload module 210 may operably couple to second portion 246 via a first wireless connection (not shown). The first wireless connection may operate in a frequency range corresponding to the operational frequency range of front vent 200. Consequently, front vent 200 may prevent electromagnetic radiation used by the first wireless connection for communication purposes from propagating outside of payload module 210 without being significantly attenuated (e.g., 90 dB). Any of the aforementioned connections may use any communication protocol without departing from this disclosure. Further, different connections may utilize different communication protocols without departing from this disclosure.

Thus, electromagnetic radiation used to support the wireless connections between devices disposed within payload module 210 and a second portion 246 may be electromagnetically isolated from the ambient environment and/or other portions of data processing device 106 (e.g., support module 208).

While optical system 240 has been illustrated as being disposed in an ambient environment and the internal volume, the portions of optical system 240 may be disposed at other locations without departing from this disclosure. For example, FIG. 2.4 illustrates a third cross section diagram of data processing device 106 of FIG. 2.1 and similar to that of FIG. 2.3, but including optical system 240 positioned near rear vent 204, in accordance with embodiments of the present disclosure. In contrast to the location of optical system 240 in FIG. 2.3, in FIG. 2.4 optical system 240 may be located in support module 208 and payload module 210 in FIG. 2.4.

When positioned as illustrated in FIG. 2.4, first portion 244 and second portion 246 may support an optical connection 242 that includes a transmission path (e.g., a line-of-sight path) through rear vent 204, rather than front vent 200 as illustrated in FIG. 2.3. By doing so, positioning of optical system 240 as illustrated in FIG. 2.4 may facilitate transmission of network data units into support module 208. In such a scenario, first portion 244 may forward network data units to communication system 224 of support module 208 rather than forwarding network data units to remote entities. Communication system 224 may appropriately forward received network data units.

Thus, the data processing devices of FIGS. 2.1-2.4 may facilitate the electromagnetic isolation of electromagnetic interference emitting devices while still enabling the electromagnetic interference emitting devices to communicate with remote entities using a wireless transmission path that traverses a vent 200 or 204 and that suppresses the electromagnetic radiation generated by the electromagnetic interference emitting devices.

FIG. 2.5 illustrates a third cross section diagram of data processing device 106 of FIG. 2.1 including optical system 240 positioned near a frequency-selective medium 252, in accordance with embodiments of the present disclosure. Frequency-selective medium 252 may include any suitable apparatus (e.g., a specially-constructed glass with suitable optical filter) which is predominantly transmissive to electromagnetic frequencies in the optical or near-optical range, but non-transmissive to electromagnetic frequencies (e.g., including radiofrequency frequencies). While frequency-selective medium 252 is shown as formed on top door 212 in FIG. 2.5, it is understood that frequency-selective medium 252 may, in some embodiments, be formed on first side 216 or the second side of chassis 201.

When positioned as illustrated in FIG. 2.5, first portion 244 and second portion 246 may support an optical connection 242 that includes a transmission path (e.g., a line-of-sight path) through frequency-selective medium 252, rather than front vent 200 as illustrated in FIG. 2.3 or rear vent 204 as illustrated in FIG. 2.4.

Thus, as in the example shown in FIG. 2.3, in FIG. 2.5, an electromagnetic interference emitting device disposed within payload module 210 may send a network data unit to second portion 246 for forwarding to a remote entity (not shown). In response to receiving the network data unit, second portion 246 may transmit the network data unit to first portion 244 using optical connection 242 through frequency-selective medium 252. Once received, a packet processor of first portion 244 may analyze the network data unit and make a determination with respect to where to send the network data unit. In addition, similar to that described with reference to the example of FIG. 2.3, first portion 244 may be operably coupled to any number of other entities via any combination of wired, wireless, and/or optical networks. Thus, first portion 244 of optical system 240 may facilitate forwarding of network data units to any number of remote entities (not expressly shown).

Thus, electromagnetic radiation used to support the wireless connections between devices disposed within payload module 210 and a second portion 246 may be electromagnetically isolated from the ambient environment and/or other portions of data processing device 106 (e.g., support module 208).

Further, use of optical system 240 as shown in FIG. 2.5 may be useful in sealed immersion cooling embodiments, in which second data processing device 206 and its internal volume 214 are fluidically sealed from its ambient environment and components of second data processing device are cooled by means of being fully submersed in a cooling liquid. Thus, care can be taken to ensure frequency-selective medium 252 is fluidically sealed onto chassis 201, and optical system 240 still provides a mechanism for communication between the interior and exterior of second data processing device 206 using line-of-sight optical communication. In embodiments involving sealed immersion cooling, frequency-selective medium 252 may not in fact be frequency-selective to optical frequencies only.

To further clarify interactions between electromagnetic interference emitting devices and optical system 240, FIG. 2.6 illustrates the third cross section diagram of data processing device 106 of FIG. 2.4 in a state where data processing device 106 has been loaded with electromagnetic interference emitting devices in accordance with embodiments of the present disclosure. As seen in FIG. 2.6, electromagnetic interference emitting devices 250 may be provided with power through interconnect 230 and feedthroughs 234.

To operably couple the electromagnetic interference emitting devices 250, the aforementioned devices may be operably coupled to second portion 246 of optical system 240. Second portion 246 may be operably coupled to first portion 244 through optical connection 242. Optical connection 242 may utilize a transmission path (e.g., a line-of-sight path) that traverses through rear vent 204.

The operable connections between electromagnetic interference emitting devices 250 and second portion 246 may operate within a first frequency band that corresponds to the frequency band in which the internal volume of payload module 210 electromagnetically isolates electromagnetic interference emitting devices 250. In contrast, optical connection 242 may utilize a second frequency band (e.g., at visible or near-visible frequencies) that is outside of the frequency band in which the internal volume of payload module 210 electromagnetically isolates electromagnetic interference emitting devices 250.

First portion 244 may provide network data unit forwarding services for network data units received from second portion 246, a communication system disposed within support module 208, and/or remote entities. By doing so, optical system 240 may operably couple electromagnetic interference emitting devices 250 to any number of entities disposed outside of the internal volume of payload module 210.

To provide the above-noted functionality of optical system 240, optical system 240 may perform all or a portion of the methods illustrated in FIGS. 3.1-3.2. The methods illustrated in the FIGS. 3.1-3.2 may be used to operably couple electromagnetic interference emitting devices with remote entities.

FIG. 3.1 illustrates a flowchart of a method 300 for facilitating communications between devices disposed in an electromagnetic interference suppressed internal volume, in accordance with embodiments of the present disclosure. According to some embodiments, method 300 may begin at step 302. As noted above, teachings of the present disclosure may be implemented in a variety of configurations of data processing devices 102. As such, the preferred initialization point for method 300 and the order of the steps comprising method 300 may depend on the implementation chosen.

Method 300 depicted in FIG. 3.1 may be used to send network data units from within internal volumes to remote recipients in accordance with one or more embodiments of this disclosure. The method shown in FIG. 3.1 may be performed completely, or in part, by, for example, data processing devices (e.g., 102, FIG. 1.1). Other components of the system illustrated in FIG. 1.1 may perform all, or a portion, of the method of FIG. 3.1 without departing from this disclosure.

At step 302, a network data unit may be obtained from an electromagnetic interference emitting device 250 by second portion 246 of an optical system 240 disposed in electromagnetic interference emitting suppressed internal volume 214.

In one or more embodiments of this disclosure, the network data unit is a packet. The network data unit may be other types of elemental data units of different communication schemes without departing from this disclosure. In one or more embodiments of this disclosure, the network data unit is obtained via an operable coupling between an electromagnetic interference emitting device 250 and second portion 246 of optical system 240. For example, an electromagnetic interference emitting device 250 may be operably coupled to second portion 246 of optical system 240 via a wireless connection. The wireless connection may operate in a frequency range corresponding to a frequency range which is electromagnetically suppressed in internal volume 214.

At step 304, the network data unit may be provided to first portion 244 of optical system 240 disposed outside of electromagnetic interference suppressed internal volume 214 via an optical connection 242 that traverses an electromagnetic radiation suppressing vent 200 or 204 or a frequency-selective medium 252 that separates first portion 244 of optical system 240 and second portion 246 of optical system 240.

At step 306, the network data unit may be forwarded by first portion 244 of optical system 240 toward a recipient.

The network data unit may be forwarded via any communications protocol without departing from this disclosure. For example, if the network operably coupled to first portion 244 of optical system 240 supports Internet Protocol communications, first portion 244 of optical system 240 may forward the network data unit using an Internet protocol-based method. In another example, if the network operably coupled to first portion 244 of optical system 240 supports Ethernet communications, first portion 244 of optical system 240 may forward the network data unit using an Ethernet protocol-based method.

After completion of step 306, method 300 may end.

Although FIG. 3.1 discloses a particular number of steps to be taken with respect to method 300, method 300 may be executed with greater or fewer steps than those depicted in FIG. 3.1. In addition, although FIG. 3.1 discloses a certain order of steps to be taken with respect to method 300, the steps comprising method 300 may be completed in any suitable order.

Method 300 may be implemented in whole or part using a data processing device 102, and/or any other system operable to implement method 300. In certain embodiments, method 300 may be implemented partially or fully in software and/or firmware embodied in computer-readable media.

FIG. 3.2 illustrates a flowchart of a method 310 of facilitating communications between devices disposed in electromagnetic interference suppressed internal volume 214, in accordance with embodiments of the present disclosure. According to some embodiments, method 310 may begin at step 312. As noted above, teachings of the present disclosure may be implemented in a variety of configurations of data processing devices 102. As such, the preferred initialization point for method 310 and the order of the steps comprising method 310 may depend on the implementation chosen.

Method 310 depicted in FIG. 3.2 may be used to send network data units from internal volumes 214 to remote recipients in accordance with one or more embodiments of this disclosure. The method shown in FIG. 3.2 may be performed completely, or in part, by, for example, data processing devices (e.g., 102, FIG. 1.1). Other components of the system illustrated in FIG. 1.1 may perform all, or a portion, of the method of FIG. 3.2 without departing from this disclosure.

At step 312, a network data unit addressed to an electromagnetic interference emitting device 250 disposed within electromagnetic interference suppressed internal volume 214 may be obtained by first portion 244 of optical system 240 disposed outside of electromagnetic interference suppressed internal volume 214.

In one or more embodiments of this disclosure, the network data unit is obtained from a remote entity. For example, the remote entity may be an information handling system. In another example, the remote entity may be an electromagnetic interference emitting device disposed in a second internal volume that is electromagnetic interference suppressed.

At step 314, the network data unit is provided to second portion 246 of optical system 240 disposed within electromagnetic interference suppressed internal volume 214 via an electromagnetic radiation suppressing vent 200 or 204 or a frequency-selective medium 252 that separates first portion 244 of optical system 240 and second portion 246 of optical system 240.

At step 316, the network data unit may be forwarded by second portion 246 of optical system 240 toward the electromagnetic interference emitting device 250 which the network data unit is addressed.

After completion of step 316, method 310 may end.

Although FIG. 3.2 discloses a particular number of steps to be taken with respect to method 310, method 310 may be executed with greater or fewer steps than those depicted in FIG. 3.2. In addition, although FIG. 3.2 discloses a certain order of steps to be taken with respect to method 310, the steps comprising method 310 may be completed in any suitable order.

Method 310 may be implemented in whole or part using a data processing device 102, and/or any other system operable to implement method 310. In certain embodiments, method 310 may be implemented partially or fully in software and/or firmware embodied in computer-readable media.

As discussed above, embodiments of this disclosure may be implemented using information handling systems. FIG. 4 illustrates a diagram of an example information handling system 400, in accordance with embodiments of the present disclosure. Information handling system 400 may include one or more processors 402, non-persistent storage 404 (e.g., volatile memory, such as random access memory (RAM), cache memory), persistent storage 406 (e.g., a hard disk, an optical drive such as a compact disk (CD) drive or digital versatile disk (DVD) drive, a flash memory, etc.), a communication interface 412 (e.g., Bluetooth interface, infrared interface, network interface, optical interface, etc.), input devices 410, output devices 408, and numerous other elements (not shown) and functionalities. Each of these components is described below.

In one embodiment of this disclosure, processor(s) 402 may be an integrated circuit for processing instructions. For example, the computer processor(s) may be one or more cores or micro-cores of a processor. Information handling system 400 may also include one or more input devices 410, such as a touchscreen, keyboard, mouse, microphone, touchpad, electronic pen, or any other type of input device. Further, communication interface 412 may include an integrated circuit for coupling information handling system 400 to a network (not shown) (e.g., a local area network (LAN), a wide area network (WAN) such as the Internet, mobile network, or any other type of network) and/or to another device, such as another computing device.

In one or more embodiments of this disclosure, information handling system 400 may include one or more output devices 408, such as a screen (e.g., a liquid crystal display (LCD), a plasma display, touchscreen, cathode ray tube (CRT) monitor, projector, or other display device), a printer, external storage, or any other output device. One or more of output devices 408 may be the same or different from the input device(s). The input and output device(s) may be locally or remotely coupled to processor(s) 402, non-persistent storage 404, and persistent storage 406. Many different types of computing devices exist, and the aforementioned input and output device(s) may take other forms.

Embodiments of this disclosure may provide a method, system, and device for managing electromagnetic interference. A system in accordance with embodiments of this disclosure may manage electromagnetic interference at a data processing device level. That is, such devices may include functionality to limit the propagation of electromagnetic interference from within data processing devices to an ambient environment surrounding the data processing device. By doing so, such data processing devices may be used in a high-density environment without negatively impacting the functionality of the high-density environment.

A data processing device in accordance with embodiments of this disclosure may provide communication services to devices disposed within the data processing device. To do so, the data processing device may include an optical connection that operates in a frequency range outside of a frequency range over which the data processing device suppresses electromagnetic interference. For example, the data processing device may implement an optical connection that uses a propagation path through an electromagnetic radiation suppressing vent or frequency-selective medium that is tuned to suppress electromagnetic radiation generated by electromagnetic interference emitting devices disposed within the data processing device. By doing so, the data processing device may electromagnetically isolate electromagnetic interference emitting devices over frequency bands on which the electromagnetic interference emitting devices are likely to radiate electromagnetic radiation. Consequently, the data processing device may simultaneously suppress relevant electromagnetic radiation while still enabling optical communication that utilizes electromagnetic radiation in visible or near-visible bands that are not relevant for electromagnetic interference suppression.

Thus, embodiments of this disclosure may address the problem of electromagnetic interference within a high-density environment. Specifically, embodiments of this disclosure may provide a data processing device level solution that facilitates granular control of electromagnetic interference in the aforementioned environments while still allowing the electromagnetic interference generating devices to communicate with remote entities.

As used herein, when two or more elements are referred to as "coupled" to one another, such term indicates that such two or more elements are in electronic communication or mechanical communication, as applicable, whether coupled indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of this disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding this disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of this disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A data processing device, comprising:
an internal volume that is electromagnetically sealed from space outside the internal volume by being electromagnetic interference (EMI) isolated;
an electromagnetic radiation (EMR) suppressing device that defines at least a portion of one wall of the internal volume; and
an optical system comprising:
a first portion, disposed in the internal volume, adapted to receive network data units from devices disposed in the internal volume; and
a second portion, disposed outside of the internal volume, adapted to obtain the network data units from and communicate the network data units to the first portion via an optical connection using transmission at optical frequencies.

2. The data processing device of claim 1, wherein the second portion is adapted to obtain the network data units from the first portion utilizing a transmission path that traverses through the EMR suppressing device.

3. The data processing device of claim 2, wherein the EMR suppressing device is an EMR suppressing vent.

4. The data processing device of claim 2, wherein the EMR suppressing device is a frequency-selective medium that is transmissive to optical frequencies and non-transmissive to frequencies lower than optical frequencies.

5. The data processing device of claim 1, wherein the second portion is further adapted to:
receive second network data units from remote entities; and
provide the second network data units to the first portion using the optical connection.

6. The data processing device of claim 5, wherein the first portion is further adapted to:
obtain the second network data units from the first portion using the optical connection; and
forward the second network data units to at least one of the devices disposed in the internal volume.

7. The data processing device of claim 1, wherein the second portion is disposed outside of a chassis of the data processing device.

8. The data processing device of claim 1, wherein the second portion is disposed in a support module of the data processing device.

9. The data processing device of claim 8, wherein the support module is disposed in a chassis of the data processing device.

10. The data processing device of claim 1, wherein:
the internal volume is fluidically sealed from space outside the internal volume;
the data processing device further comprises an optically-transmissive medium that defines at least a portion of one wall of the internal volume; and
the second portion is adapted to obtain the network data units from the first portion utilizing a transmission path that traverses through the optically-transmissive medium.

11. A method comprising:
obtaining, by a first portion of an optical system disposed in an internal volume of a data processing device, a network data unit from a device from one or more devices disposed in the internal volume;
providing, to a second portion of the optical system disposed outside of the sealed internal volume, the network data unit via an optical connection using transmission at optical frequencies; and
forwarding, by the second portion of the optical system, the network data unit towards a recipient;
wherein the internal volume is electromagnetically sealed from space outside the internal volume by being electromagnetic interference (EMI) isolated; and
wherein an electromagnetic radiation (EMR) suppressing device separates the first portion of the optical system from the second portion of the optical system.

12. The method of claim 11, wherein the optical connection utilizes a transmission path that traverses (the EMR) suppressing device.

13. The method of claim 12, wherein the EMR suppressing device is an EMR suppressing vent.

14. The method of claim 12, wherein the EMR suppressing device is a frequency-selective medium that is transmissive to optical frequencies and non-transmissive to frequencies lower than optical frequencies.

15. The method of claim 11, wherein the optical connection utilizes a transmission path that traverses an optically-transmissive medium that separates the first portion of the optical system from the second portion of the optical system.

16. The method of claim 11, further comprising:
obtaining, by the second portion of the optical system, a second network data unit that is addressed to one of the one or more devices disposed within the sealed internal volume;
providing, to the first portion of the optical system, the second network data unit via the optical connection; and
forwarding, by the first portion, the network data unit towards the to one of the one or more devices.

17. A non-transitory computer readable medium comprising instructions that when executed by a data processing device cause the data processing device to perform a method comprising:
obtaining, by a first portion of an optical system disposed in an internal volume of a data processing device, a network data unit from a device from one or more devices disposed in the internal volume;
providing, to a second portion of the optical system disposed outside of the sealed internal volume, the network data unit via an optical connection using transmission at optical frequencies; and
forwarding, by the second portion of the optical system, the network data unit towards a recipient;
wherein the internal volume is electromagnetically sealed from space outside the internal volume by being electromagnetic interference (EMI) isolated; and
wherein an electromagnetic radiation (EMR) suppressing device separates the first portion of the optical system from the second portion of the optical system.

18. The non-transitory computer readable medium of claim 17,
wherein the optical connection utilizes a transmission path that traverses (the EMR) suppressing device.

19. The non-transitory computer readable medium of claim 18, wherein the EMR suppressing device is an EMR suppressing vent.

20. The non-transitory computer readable medium of claim 18, wherein the EMR suppressing device is a frequency-selective medium that is transmissive to optical frequencies and non-transmissive to frequencies lower than optical frequencies.

21. The non-transitory computer readable medium of claim 17,
wherein the optical connection utilizes a transmission path that traverses an optically-transmissive medium that separates the first portion of the optical system from the second portion of the optical system.

22. The non-transitory computer readable medium of claim 17, wherein the method further comprises:
obtaining, by the second portion of the optical system, a second network data unit that is addressed to one of the one or more devices disposed within the sealed internal volume;
providing, to the first portion of the optical system, the second network data unit via the optical connection; and
forwarding, by the first portion, the network data unit towards the to one of the one or more devices.

* * * * *

UNITED STATES PATENT AND TRADEMARK OFFICE
CERTIFICATE OF CORRECTION

| | |
|---|---|
| PATENT NO. | : 11,409,474 B2 |
| APPLICATION NO. | : 16/853177 |
| DATED | : August 9, 2022 |
| INVENTOR(S) | : Embleton et al. |

It is certified that error appears in the above-identified patent and that said Letters Patent is hereby corrected as shown below:

In the Claims

1. In Column 25, Line 39, Claim 12, delete "traverses (the EMR)" and insert -- traverses the EMR --, therefor.

2. In Column 26, Line 28, Claim 18, delete "traverses (the EMR)" and insert -- traverses the EMR --, therefor.

Signed and Sealed this
Twenty-eighth Day of November, 2023

Katherine Kelly Vidal
*Director of the United States Patent and Trademark Office*